(12) United States Patent
Kawadahara (10) Patent No.: US 11,984,328 B2
(45) Date of Patent: May 14, 2024

(54) SEMICONDUCTOR MANUFACTURING APPARATUS AND SEMICONDUCTOR MANUFACTURING METHOD (71) Applicant: Kioxia Corporation, Tokyo (JP)

(72) Inventor: Sho Kawadahara, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 283 days.

(21) Appl. No.: 17/468,187

(22) Filed: Sep. 7, 2021

(65) Prior Publication Data
US 2022/0285176 A1 Sep. 8, 2022

(30) Foreign Application Priority Data

Mar. 4, 2021 (JP) ................. 2021-034700

(51) Int. Cl.
*H01L 21/67* (2006.01)
*H01L 21/683* (2006.01)

(52) U.S. Cl.
CPC .. *H01L 21/67092* (2013.01); *H01L 21/67248* (2013.01); *H01L 21/6838* (2013.01); *H01L 21/67126* (2013.01)

(58) Field of Classification Search
CPC ......... H01L 21/67092; H01L 21/67248; H01L 21/6838; H01L 21/67126; B32B 41/00; B32B 2309/02; B32B 2309/022; B32B 2309/12
See application file for complete search history.

(56) References Cited

U.S. PATENT DOCUMENTS

2009/0317960 A1* 12/2009 Izumi ................ H01L 21/67092
  438/455
2010/0097738 A1   4/2010 Kang et al.
2014/0370787 A1* 12/2014 Duescher ................ B24B 37/30
  451/388

FOREIGN PATENT DOCUMENTS

| JP | 3318776 B2 | 8/2002 |
| JP | 2005-197269 A | 7/2005 |
| JP | 2009-070896 A | 4/2009 |
| JP | 2009-294551 A | 12/2009 |
| JP | 2009294551 A * | 12/2009 |
| JP | 2010-098289 A | 4/2010 |
| JP | 2014-150201 A | 8/2014 |

(Continued)

OTHER PUBLICATIONS

Translation of JP 2009294551 A, Komoda Daisuke, Dec. 2009 (Year: 2009).*

*Primary Examiner* — George R Koch
(74) *Attorney, Agent, or Firm* — Foley & Lardner LLP (57) ABSTRACT

A semiconductor manufacturing apparatus according to an embodiment includes a first chamber, a second chamber, and a fluid pressure applier. The first chamber includes a first film and a first container. The first film is deformable. The first container contains an incompressible fluid that causes the first film to be deformed. The second chamber includes a second film and a second container. The second film faces the first film. The second film is deformable. The second container contains the incompressible fluid that causes the second film to be deformed. The fluid pressure applier is configured to apply a pressure to the incompressible fluid of each of the first chamber and the second chamber to cause the first film and the second film to be deformed in bonding a plurality of substrates to each other between the first film and the second film.

8 Claims, 4 Drawing Sheets (56) References Cited

FOREIGN PATENT DOCUMENTS

| JP | 2018-129546 A | 8/2018 |
|---|---|---|
| JP | 2018-190826 A | 11/2018 |
| TW | 201812856 A | 4/2018 |

\* cited by examiner

SEMICONDUCTOR MANUFACTURING APPARATUS AND SEMICONDUCTOR MANUFACTURING METHOD

CROSS-REFERENCE TO RELATED APPLICATION

This application is based upon and claims the benefit of priority from Japanese Patent Application No. 2021-034700, filed Mar. 4, 2021; the entire contents of which are incorporated herein by reference.

FIELD

Embodiments described herein relate generally to a semiconductor manufacturing apparatus and a semiconductor manufacturing method.

BACKGROUND

In a semiconductor manufacturing process, a connection apparatus that connects two substrates is known.

DETAILED DESCRIPTION

A semiconductor manufacturing apparatus according to an embodiment includes a first chamber, a second chamber, and a fluid pressure applier. The first chamber includes a first film and a first container. The first film is deformable. The first container contains an incompressible fluid that causes the first film to be deformed. The second chamber includes a second film and a second container. The second film faces the first film. The second film is deformable. The second container contains the incompressible fluid that causes the second film to be deformed. The fluid pressure applier is configured to apply a pressure to the incompressible fluid of each of the first chamber and the second chamber to cause the first film and the second film to be deformed in bonding a plurality of substrates to each other between the first film and the second film.

Hereinafter, a semiconductor manufacturing apparatus including a substrate bonding apparatus according to an embodiment and a substrate bonding method (semiconductor manufacturing method) will be described with reference to the drawings.

In the following description, the same reference signs are given to components having the same or similar function. Duplicate description of these components may be omitted. The drawings are schematic or conceptual, and a relationship between a thickness and a width of each portion, ratios of sizes between portions, or the like are not necessarily the same as in reality.

An X-direction, a Y-direction, a Z-direction, and a radial direction will be defined in advance.

The X-direction and the Y-direction are directions that are parallel to a substrate of a layered substrate 100 which will be described later. The Z-direction is a direction that intersects with (for example, is orthogonal to) the X-direction and the Y-direction. In other words, the Z-direction is a thickness direction of the layered substrate 100 and is a direction perpendicular to the layered substrate 100. In the Z-direction, a direction from a first film 11 which will be described later to a second film 21 may be referred to as a plan view.

When the layered substrate 100 is viewed from the Z-direction, the radial direction means a direction from a center of the layered substrate 100 toward a circumferential edge of the layered substrate 100 or a direction from the circumferential edge of the layered substrate 100 toward the center of the layered substrate 100. Furthermore, regarding the radial direction, the direction from the center of the layered substrate 100 toward the circumferential edge of the layered substrate 100 may be referred to as a "radially outward direction", and the direction from the circumferential edge of the layered substrate 100 to the center of the layered substrate 100 may be referred to as a "radially inward direction".

Embodiment

<Entire Configuration of Semiconductor Manufacturing Apparatus>

First of all, an entire configuration of a semiconductor manufacturing apparatus 1 according to the embodiment will be described.

Figure 1:
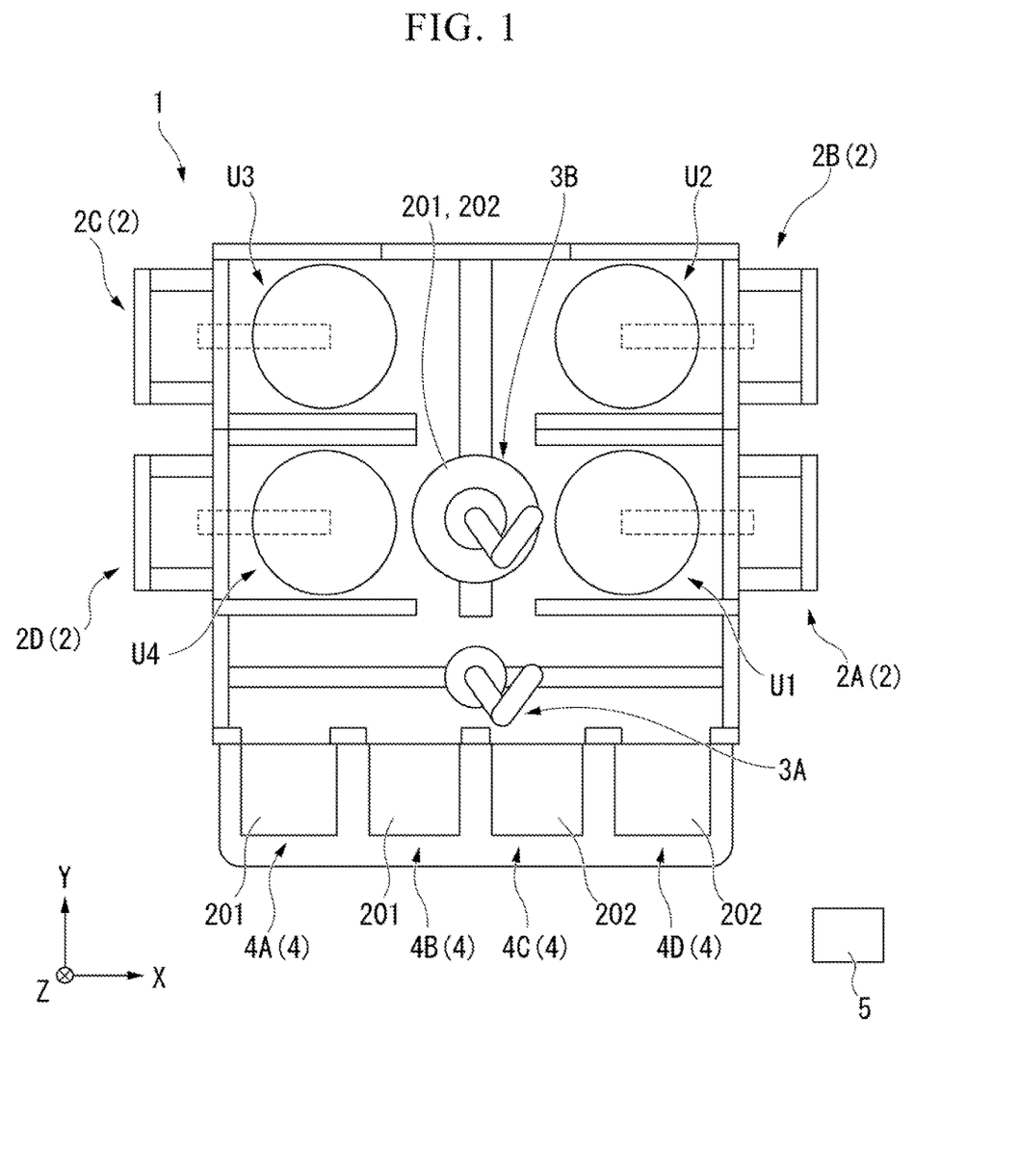
FIG. 1 is a schematic plan view showing an entire configuration of a semiconductor manufacturing apparatus according to an embodiment.

FIG. 1 is a schematic plan view showing a configuration of the semiconductor manufacturing apparatus 1.

The semiconductor manufacturing apparatus 1 includes, for example, processing units U1 to U4, a first transfer device 3A, a second transfer device 3B, four substrate holders 4A to 4D, and a controller 5. In the embodiment, the processing units U1 to U4 are, for example, substrate bonding apparatuses 2A to 2D (2).

Although FIG. 1 shows a configuration in which the semiconductor manufacturing apparatus 1 includes the four substrate bonding apparatuses 2, the number of the substrate bonding apparatuses 2 is not limited to this embodiment. The semiconductor manufacturing apparatus 1 may be configured by a combination of the substrate bonding apparatus 2 and a known processing unit such as a film formation apparatus, an etching apparatus, an annealing apparatus, or the like. In the semiconductor manufacturing apparatus 1, the number of the processing units is not limited to this embodiment, and five or more processing units may be provided therein.

Furthermore, one of the processing units U1 to U4 constituting the semiconductor manufacturing apparatus 1 may be a pre-processing apparatus that forms the layered substrate 100 from a plurality of substrates.

The first transfer device 3A transfers, for example, a pre-treatment substrate 201 before being subjected to a substrate bonding process to the second transfer device 3B. The first transfer device 3A receives, for example, a post-treatment substrate 202 after being subjected to a substrate bonding process from the second transfer device 3B.

The second transfer device 3B transfers the pre-treatment substrate 201 to any one of the four substrate bonding apparatuses 2A to 2D or transfers the post-treatment substrate 202 from the four substrate bonding apparatuses 2A to 2D.

Of the four substrate holders 4A to 4D, the substrate holders 4A and 4B store, for example, the pre-treatment substrate 201. The substrate holders 4C and 4D store, for example, the post-treatment substrate 202.

The controller 5 includes, for example, a control circuit. The controller 5 is electrically connected to the substrate bonding apparatuses 2A to 2D, the first transfer device 3A, the second transfer device 3B, and the substrate holders 4A to 4D. The controller 5 comprehensively controls the semiconductor manufacturing apparatus 1. The controller 5 is, for example, a computer. The controller 5 includes a recording medium in which a computer program that carries out a plurality of steps of a substrate bonding method which will be described later is stored. The controller 5 executes each of the steps of the substrate bonding method.

<Substrate Bonding Apparatus>

In the following explanation, the substrate bonding apparatus 2A (2) that is one of the four substrate bonding apparatuses 2A to 2D will be described. Since the configurations of the other substrate bonding apparatuses 2B to 2D are the same as that of the substrate bonding apparatus 2A, the explanation therefor is omitted.

The substrate bonding apparatus 2 is an apparatus that carries out a bonding process with respect to the pre-treatment substrate 201 transferred by the first transfer device 3A. In other words, the substrate bonding apparatus 2 is an apparatus that applies a pressure to the substrates in the thickness direction in a state in which the substrates are layered in advance, and thereby bonds the substrates. For this reason, "a plurality of substrates (substrates)" that is a processing object to be subjected to the bonding process by the substrate bonding apparatus 2 may be referred to as a "layered substrate" in the following explanation.

<Layered Substrate>

Figure 2:
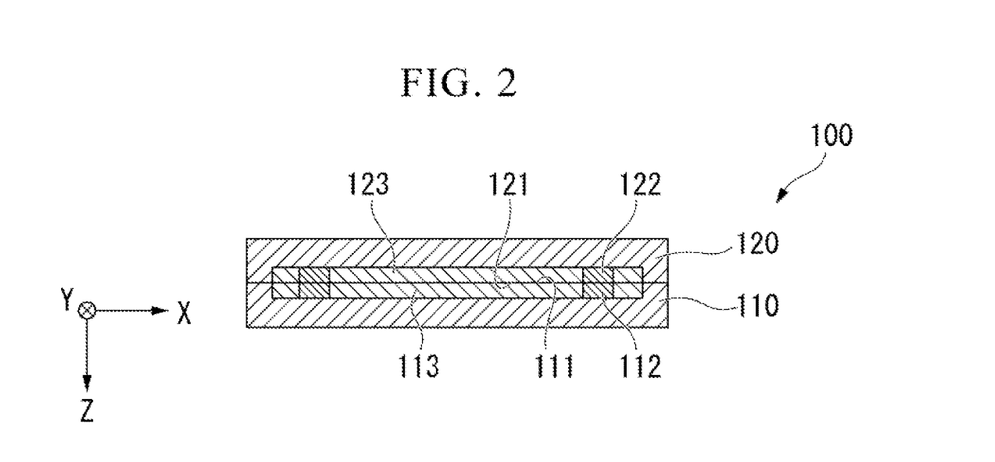
FIG. 2 is a cross-sectional view showing a layered substrate bonded by a substrate bonding apparatus according to the embodiment.

FIG. 2 is a cross-sectional view showing the layered substrate 100 bonded by the substrate bonding apparatus 2.

The layered substrate 100 is configured by a first substrate 110 and a second substrate 120. Each of the first substrate 110 and the second substrate 120 is, for example, a known semiconductor wafer formed in a disk shape.

First connection terminals 112 and a plurality of cells 113 each including a logic circuit are formed on, for example, a first substrate surface 111 of the first substrate 110 facing the second substrate 120.

Second connection terminals 122 and a plurality of cells 123 each including a memory cell circuit are formed on, for example, a second substrate surface 121 of the second substrate 120 facing the first substrate 110.

The first connection terminals 112 and the second connection terminals 122 are terminals made of copper or the like.

In the Z-direction, positions of the first connection terminals 112 correspond to positions of the second connection terminals 122.

By applying a pressure to the layered substrate 100 in the Z-direction via the substrate bonding apparatus 2 which will be described later, the first connection terminals 112 are bonded one-to-one to the second connection terminals 122.

Note that, although each of "the substrates" in the following explanation is the first substrate 110 or the second substrate 120, the number of substrates constituting the layered substrate 100 is not limited to two but may be three or more.

Figure 3:
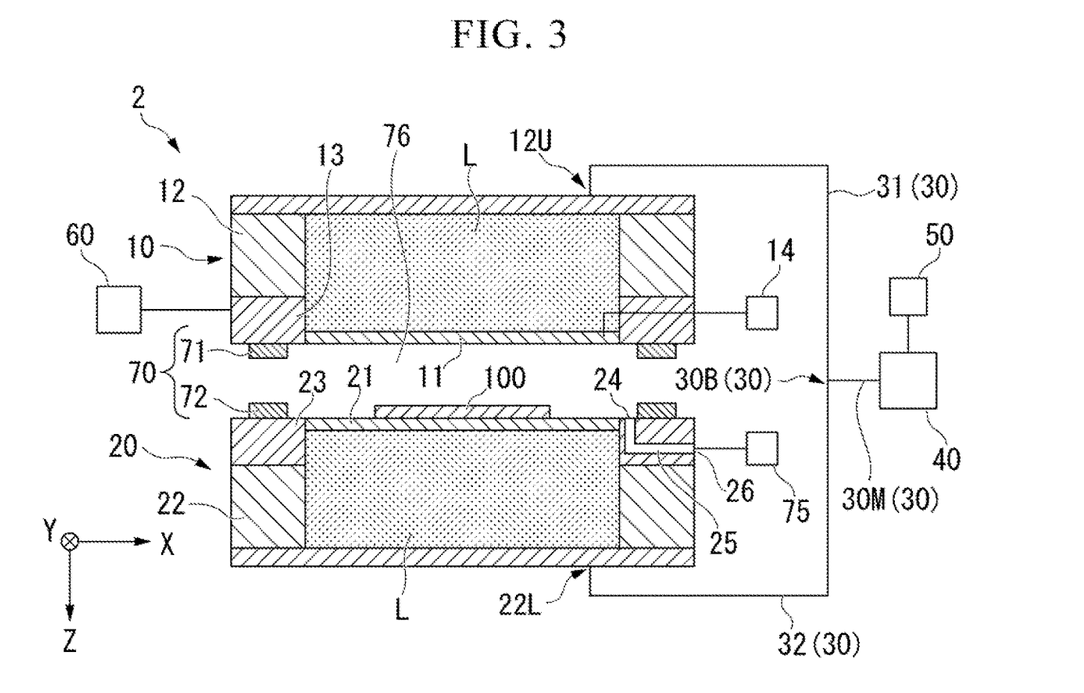
FIG. 3 is a schematic cross-sectional view showing a configuration of the substrate bonding apparatus according to the embodiment.

FIG. 3 is a schematic cross-sectional view showing a configuration of the substrate bonding apparatus 2.

The substrate bonding apparatus 2 includes, for example, a first chamber 10, a second chamber 20, a flow-channel structure 30, and a fluid pressure adjuster 40. The fluid pressure adjuster 40 is an example of the fluid pressure applier.

<First Chamber>

The first chamber 10 includes a first film 11 and a first container 12. The first film 11 is deformable. The first container 12 contains an incompressible fluid L that causes the first film 11 to be deformed. A wall (a side wall and an upper wall) forming the first container 12 is formed of a known metal material such as aluminum. The wall tightly seals the inside of the first container 12.

A first connection opening 12U that communicates a first flow channel 31 which will be described later is formed on a part of the upper wall of the first container 12. The insides of the first container 12 and the first flow channel 31 are filled with the incompressible fluid L that can flow between the first container 12 and the first flow channel 31. The pressure of the incompressible fluid L generated by the fluid pressure adjuster 40 can be transmitted to the incompressible fluid L inside the first container 12 via the first flow channel 31.

The first container 12 includes a first outer-peripheral portion 13 that faces a second outer-peripheral portion 23 of a second container 22 of the second chamber 20. An outer-periphery of the first film 11 is fixed to, for example, the first outer-peripheral portion 13. As long as deformation of the first film 11 is not hindered, a fixing structure that fixes the first film 11 to the first outer-peripheral portion 13 is not limited to this embodiment. Note that, a first seal 71 that constitutes a seal 70 which will be described later is provided on the first outer-peripheral portion 13.

<Second Chamber>

The second chamber 20 includes a second film 21 facing the first film 11 and the second container 22. The second film 21 is deformable. The second container 22 contains the incompressible fluid L that causes the second film 21 to be deformed. A wall (a side wall and a lower wall) forming the second container 22 is formed of a known metal material such as aluminum which is similar to the first container 12. The wall tightly seals the inside of the second container 22.

A second connection opening 22L that communicates a second flow channel 32 which will be described later is formed on a part of the lower wall of the second container 22. The insides of the second container 22 and the second flow channel 32 are filled with the incompressible fluid L that can flow between the second container 22 and the second flow channel 32. The pressure of the incompressible fluid L generated by the fluid pressure adjuster 40 can be transmitted to the incompressible fluid L inside the second container 22 via the second flow channel 32.

The second container 22 includes the second outer-peripheral portion 23 that faces the first outer-peripheral portion 13 of the first container 12 of the first chamber 10. An outer-periphery of the second film 21 is fixed to, for example, the second outer-peripheral portion 23. As long as deformation of the second film 21 is not hindered, a fixing structure that fixes the second film 21 to the second outer-peripheral portion 23 is not limited to this embodiment. Note that, a second seal 72 that constitutes the seal 70 which will be described later is provided on the second outer-peripheral portion 23.

An inner exhaust port 24 is formed at a position between the second seal 72 and the second film 21 at a region inside the second seal 72 on the second outer-peripheral portion 23. An inner exhaust path 25 that extends in the Z-direction and the X-direction is formed inside the side wall of the second container 22. An outer exhaust port 26 is formed on an outer surface of the side wall of the second container 22. The inner exhaust port 24 communicates the inner exhaust path 25 and the outer exhaust port 26. The outer exhaust port 26 is connected to a first pressure reducer 75 which will be described later.

Note that, in the embodiment, a case will be described in which the inner exhaust port 24, the inner exhaust path 25, and the outer exhaust port 26 are formed on the second chamber; however, the inner exhaust port 24, the inner exhaust path 25, and the outer exhaust port 26 may be formed on the first chamber 10.

<First Film and Second Film>

Materials used to form the first film 11 and the second film 21 may be the same as each other or may be different from each other. As the materials used to form the first film 11 and the second film 21, a material having flexibility, for example, a silicone rubber, is adopted. The kind of such material is not limited to the silicone rubber. In the case of heating the layered substrate 100, it is preferable that the first film 11 and the second film 21 be formed of a material having heat resistance (for example, a heat resistance rubber or the like).

As long as it is possible to uniformly apply a pressure to the layered substrate 100 along with deformation of the first film 11 and the second film 21 due to the pressurized incompressible fluid L, a film thickness or a diameter of each of the first film 11 and the second film 21 is not limited to this embodiment.

Figure 4:
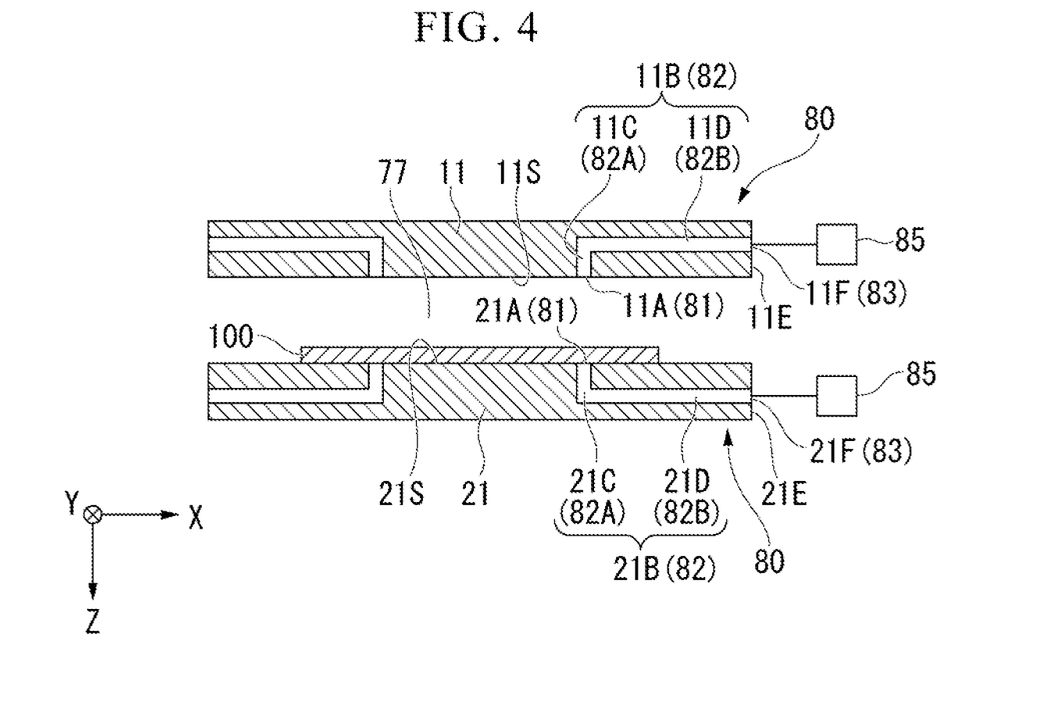
FIG. 4 is a partial cross-sectional view showing a substrate attractor that constitutes the substrate bonding apparatus according to the embodiment.
Figure 5:
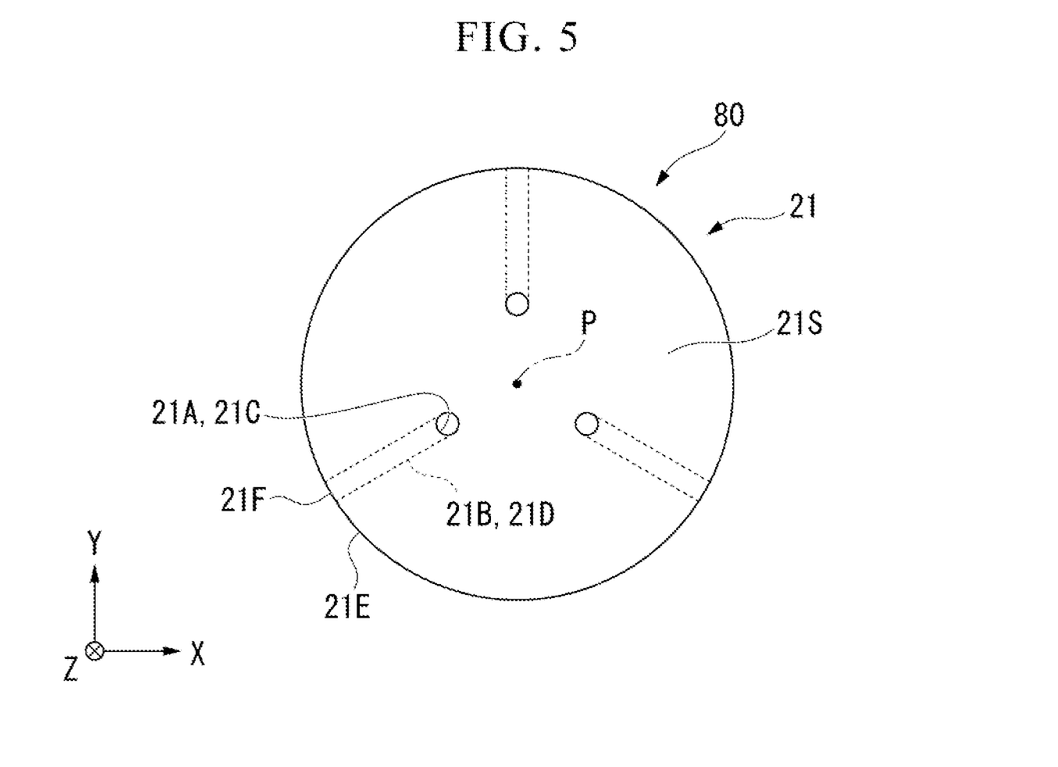
FIG. 5 is a plan view showing the substrate attractor that constitutes the substrate bonding apparatus according to the embodiment.

Furthermore, as shown in FIGS. 4 and 5 which will be described later, each of the first film 11 and the second film 21 includes a substrate attractor 80 that attracts and holds the layered substrate 100.

<Incompressible Fluid>

As the incompressible fluid L, fluid such as water (deionized water or the like), oil (mineral oil or the like), a solvent (an organic solvent, for example, a polyethylene glycol monoether based solvent), or the like is adopted. In the embodiment, as the incompressible fluid L, oil is used. As long as it is possible to transmit the pressure generated by the fluid pressure adjuster 40 to the first film 11 and the second film 21, the material of the incompressible fluid L is not limited to this embodiment.

<Flow-Channel Structure>

The flow-channel structure 30 is provided between the first chamber 10 and the fluid pressure adjuster 40 and between the second chamber 20 and the fluid pressure adjuster 40. Specifically, the flow-channel structure 30 includes a main channel 30M, a flow-channel branch part 30B, the first flow channel 31, and the second flow channel 32. The flow-channel branch part 30B splits the main channel 30M into the first flow channel 31 and the second flow channel 32.

The first flow channel 31 is connected to the first connection opening 12U of the first chamber 10 and communicates the inside of the first container 12. The second flow channel 32 is connected to the second connection opening 22L of the second chamber 20 and communicates the inside of the second container 22. The inside of the first flow channel 31 and the inside of the second flow channel 32 are filled with the incompressible fluid L.

When the fluid pressure adjuster 40 applies a pressure to the incompressible fluid L, the pressure is transmitted to the incompressible fluid L filling each of the insides of the first flow channel 31 and the second flow channel 32.

<Fluid Pressure Adjuster>

The fluid pressure adjuster 40 is electrically connected to the controller 5. The operation of the fluid pressure adjuster 40 is controlled by the controller 5.

The fluid pressure adjuster 40 communicates the main channel 30M of the flow-channel structure 30.

The fluid pressure adjuster 40 functions as a master reservoir that stores the incompressible fluid L therein. The fluid pressure adjuster 40 has a known oil hydraulic cylinder structure and includes a cylinder filled with the incompressible fluid L and a piston that is reciprocally movable in the cylinder. In the fluid pressure adjuster 40, when the piston presses the incompressible fluid L, a pressure is applied to the incompressible fluid L filling the inside of the cylinder, and the pressure is transmitted to the incompressible fluid L filling the inside of the flow-channel structure 30.

<Temperature Sensor>

A temperature sensor 14 measures at least one of temperatures of the first film 11 and the second film 21. In the embodiment, the temperature sensor 14 is provided at the first film 11. Consequently, the temperature sensor 14 can measure a temperature of the incompressible fluid L via the first film 11. In the embodiment, although the temperature sensor 14 is provided only at the first film 11, the temperature sensor 14 may be disposed only at the second film 21 or may be disposed at both the first film 11 and the second film 21. As the temperature sensor 14, a known sensor such as thermocouple or the like is used in the embodiment. The kind of the temperature sensor 14 is not limited to the embodiment.

<Temperature Controller>

A temperature controller 50 is electrically connected to the temperature sensor 14 and the controller 5. The operation of the temperature controller 50 is controlled by the controller 5.

The temperature controller 50 is provided at the fluid pressure adjuster 40, and controls the temperature of the incompressible fluid L inside the cylinder forming the fluid pressure adjuster 40.

When the fluid pressure adjuster 40 causes the first film 11 and the second film 21 to deform and thereby bonds the layered substrate 100, the temperature controller 50 controls the temperature of the incompressible fluid L of each of the first chamber 10 and the second chamber 20 based on a measurement result obtained by the temperature sensor 14.

<Mover>

A mover 60 is a driver that moves the first chamber 10 in the Z-direction. As the mover, for example, a motor or like is used. The mover 60 adjusts a distance between the first film 11 and the second film 21. The mover 60 can cause the first film 11 to be close to the second film 21 or can cause the first film 11 to be away from the second film 21.

The mover 60 is electrically connected to the controller 5. The operation of the mover 60 is controlled by the controller 5.

In the embodiment, although the position of the second chamber 20 in the Z-direction is fixed and the mover 60 moves the first chamber 10 relative to the second chamber 20 in the Z-direction, the embodiment is not limited to such configuration. As long as the distance between the first film 11 and the second film 21 can be adjusted, for example, the position of the first chamber 10 is fixed in the Z-direction, and the second chamber 20 may move relative to the first chamber 10 in the Z-direction. Additionally, both the first chamber 10 and the second chamber 20 may move relative to each other in the Z-direction.

<Seal>

The seal 70 is formed of the first seal 71 provided at the first outer-peripheral portion 13 of the first container 12 and the second seal 72 provided at the second outer-peripheral portion 23 of the second container 22. That is, the seal 70 is provided between the first chamber 10 and the second chamber 20. As the first chamber 10 and the second chamber 20 move to come close to each other, the seal 70 formed of the first seal 71 and the second seal 72 surrounds the peripheries of the first film 11 and the second film 21. When the first seal 71 and the second seal 72 come into contact with each other, the seal 70 can tightly seal a space 76 surrounded by the first film 11, the second film 21, and the seal 70.

As the seal 70, for example, a configuration in which each of the first seal 71 and the second seal 72 is formed of a sealing rubber is adopted. As long as airtightness of the space 76 can be obtained, the kind of the material of the sealing rubber is not limited.

Note that, the material of each of the first seal 71 and the second seal 72 may not be such sealing rubber. For example, as the seal 70, a configuration may be adopted in which an O-ring (first seal 71) and a pressing surface (second seal 72) are combined. In this case, the O-ring is provided at the first outer-peripheral portion 13 of the first container 12, and the pressing surface is located on the second outer-peripheral portion 23 of the second container 22 and is capable of pressing the O-ring.

Moreover, the configuration of the seal 70 is not limited to such configuration. As long as the space 76 between the first film 11 and the second film 21 can be tightly sealed, a known seal structure is applicable to the seal 70.

<First Pressure Reducer>

The first pressure reducer 75 depressurizes the inside of the airtight space 76 surrounded by the first film 11, the second film 21, and the seal 70. The first pressure reducer 75 is connected to the outer exhaust port 26 formed at the side wall of the second container 22. The first pressure reducer 75 depressurizes the inside of the space 76 via the inner exhaust port 24, the inner exhaust path 25, and the outer exhaust port 26.

The first pressure reducer 75 is electrically connected to the controller 5. The operation of the first pressure reducer 75 is controlled by the controller 5. The first pressure reducer 75 is provided with a known vacuum pump and a known vacuum valve. Whether or not the inside of the space 76 is depressurized is controlled by operation of opening and closing the vacuum valve.

<Substrate Attractor>

FIG. 4 is a partial cross-sectional view showing the substrate attractor 80. FIG. 5 is a plan view showing the substrate attractor 80. Particularly, FIG. 5 shows the second film 21 in a plan view. Since the configuration of the second film 21 shown in FIG. 5 is the same as the configuration of the first film 11, the explanation of the first film 11 may be omitted in the following explanation with reference to FIG. 5.

As shown in FIG. 4, each of the first film 11 and the second film 21 includes the substrate attractor 80.

The substrate attractor 80 attracts and holds a part of the layered substrate 100 disposed in a space 77 between the first film 11 and the second film 21. The substrate attractor 80 has inner holes 81, attraction paths 82, and outer holes 83.

Each of the inner holes 81 communicates the space 77 between the first film 11 and the second film 21. Each of the attraction paths 82 includes: a vertical-attraction path 82A that communicates the inner hole 81 and that extends in the Z-direction; and a horizontal-attraction path 82B that communicates the vertical-attraction path 82A and that extends in the radial direction. Each of the outer holes 83 communicates the horizontal-attraction path 82B of the attraction path 82 and opens at the outside of the substrate attractor 80.

In other words, the first film 11 has a first surface 11S facing the second film 21. A first inner hole 11A corresponding to the inner hole 81 is formed on the first surface 11S. A first attraction path 11B corresponding to the attraction path 82 is formed inside the first film 11.

The first attraction path 11B has: a first vertical-attraction path 11C (vertical-attraction path 82A) that communicates the first inner hole 11A and that extends in the Z-direction; and a first horizontal-attraction path 11D (horizontal-attraction path 82B) that communicates the first vertical-attraction path 11C and that extends in the radial direction. A first outer hole 11F corresponding to the outer hole 83 is formed on a side surface 11E of the first film 11. The first outer hole 11F communicates the first horizontal-attraction path 11D.

Similarly, the second film 21 has a second surface 21S facing the first film 11. A second inner hole 21A corresponding to the inner hole 81 is formed on the second surface 21S. A second attraction path 21B corresponding to the attraction path 82 is formed inside the second film 21.

The second attraction path 21B has: a second vertical-attraction path 21C (vertical-attraction path 82A) that communicates the second inner hole 21A and that extends in the Z-direction; and a second horizontal-attraction path 21D (horizontal-attraction path 82B) that communicates the second vertical-attraction path 21C and that extends in the radial direction. A second outer hole 21F corresponding to the outer hole 83 is formed on a side surface 21E of the second film 21. The second outer hole 21F communicates the second horizontal-attraction path 21D.

As shown in FIG. 5, when the second film 21 is viewed in a plan view, the three second inner holes 21A are formed on the second surface 21S. The second attraction path 21B that extends from the center of the second surface 21S in the radially outward direction is connected to each second inner hole 21A.

The three second inner holes 21A are disposed at positions which are away from the center P of the second surface 21S at an equal distance.

The three second outer holes 21F are formed at positions at an equal distance in a circumferential direction of the second film 21 on the side surface 21E (circumferential edge) of the second film 21. In the embodiment, the arrangement interval of the three second outer holes 21F is, for example, 120 degrees.

The attraction pathway pattern (three-dimensional shape of the substrate attractor 80) such as the position of the second inner hole 21A, the pathway of the second attraction path 21B, and the arrangement interval of the second outer hole 21F or the like are not limited to the configuration shown in FIGS. 4 and 5. For example, a branch portion that splits one attraction path into a plurality of attraction paths may be formed inside the second film 21.

As long as it is possible to uniformly apply a pressure to the layered substrate 100 along with deformation of the first film 11 and the second film 21 due to the pressurized incompressible fluid L, the attraction pathway pattern of the substrate attractor 80 formed in the first film 11 and the second film 21 is not limited to this embodiment.

In the embodiment, the case is described in which both the first film 11 and the second film 21 include the substrate attractor 80, but only one of the first film 11 and the second film 21 may include the substrate attractor 80. Note that, in the substrate bonding method which will be described later, a case will be described in which attraction using the first film 11 is not carried out but attraction using the second film 21 is carried out.

<Second Pressure Reducer>

A second pressure reducer 85 is connected to the substrate attractor 80, that is, connected to each of the first outer hole 11F and the second outer hole 21F. It is possible to depressurize the inside of the attraction path 82 of the substrate attractor 80 via the operation of the second pressure reducer 85, and particularly, it is possible to attract and hold a part of the layered substrate 100 which comes into contact with the first surface 11S of the first film 11 or the second surface 21S of the second film 21.

The second pressure reducer 85 is electrically connected to the controller 5. The operation of the second pressure reducer 85 is controlled by the controller 5. The second pressure reducer 85 is provided with a known vacuum pump and a known vacuum valve. Whether or not the inside of the substrate attractor 80 is depressurized is controlled by operation of opening and closing the vacuum valve.

Although the second pressure reducer 85 is connected to each of the first film 11 and the second film 21 in the configuration shown in FIG. 4, the embodiment is not limited to such configuration. For example, the second pressure reducer 85 may be configured by a first vacuum valve and a second vacuum valve which correspond to the first film 11 and the second film 21, respectively, and one vacuum pump that is connected to each vacuum valve. In this case, substrate attraction operation by each of the first film 11 and the second film 21 is controlled by operations of opening and closing the first vacuum valve and the second vacuum valve.

Furthermore, in the embodiment, the second pressure reducer 85 is independent from the first pressure reducer 75, but the embodiment is not limited to such configuration. For example, an intensive pressure reducer that includes a vacuum valve achieving operation of the first pressure reducer 75, a vacuum valve achieving operation of the second pressure reducer 85, and a single vacuum pump may be used. In this case, for example, in a state in which the single vacuum pump is driven, operation of each of the first pressure reducer 75 and the second pressure reducer 85 can be achieved by controlling operation of opening and closing each vacuum valve.

<Substrate Bonding Method>

Figure 6:
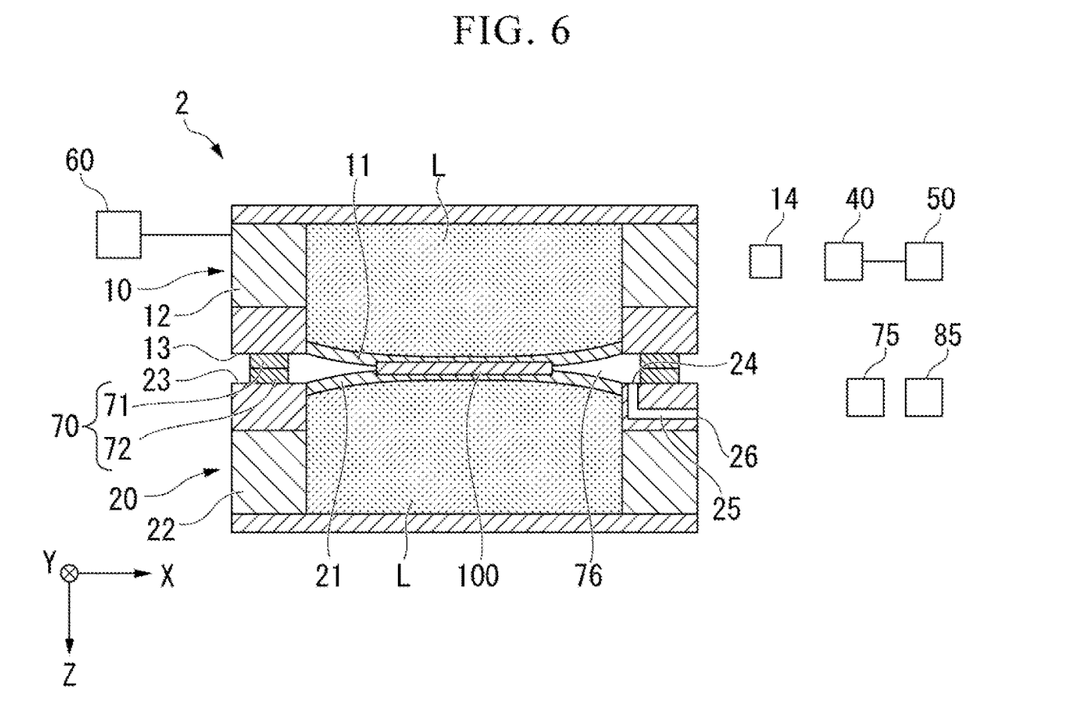
FIG. 6 is a schematic cross-sectional view showing a configuration of the substrate bonding apparatus according to the embodiment.
Figure 7:
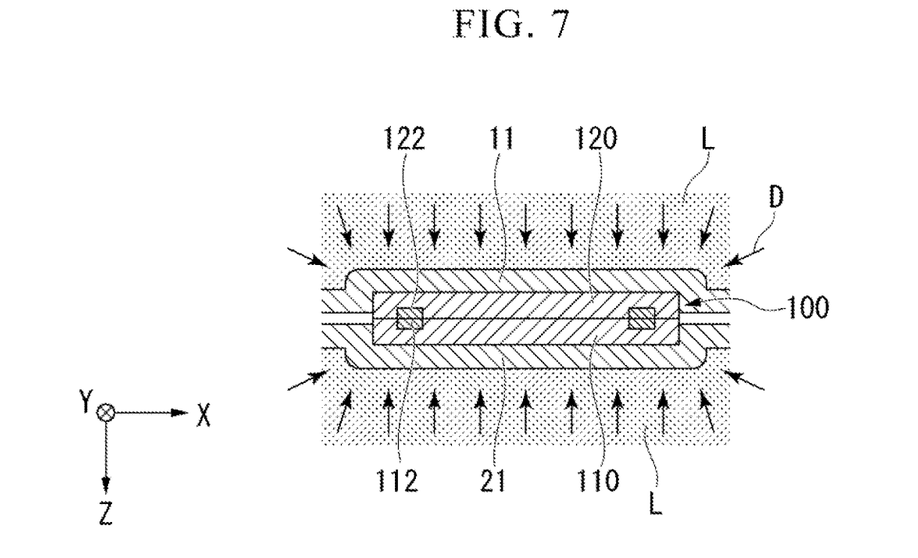
FIG. 7 is a partial cross-sectional view showing: a first film and a second film which constitute the substrate bonding apparatus according to the embodiment; and the layered substrate sandwiched between the first film and the second film.

Next, a substrate bonding method using the substrate bonding apparatus 2 according to the embodiment will be described. FIGS. 6 and 7 are views for explanation of a substrate bonding method. Note that, in FIG. 6, the flow-channel structure 30 is omitted.

The substrate bonding method includes the following Steps 1 to 11.
 (Step 1) Transfer of the layered substrate 100 to the substrate bonding apparatus 2
 (Step 2) Attraction of the layered substrate 100 by the second film 21 of the second chamber 20
 (Step 3) Downward movement of the first chamber 10
 (Step 4) Decompression of the space 76

(Step 5) Temperature control of the incompressible fluid L
 (Step 6) Application of pressure to the layered substrate 100
 (Step 7) Release of application of pressure to the layered substrate 100
 (Step 8) Release of decompression of the space 76
 (Step 9) Upward movement of the first chamber 10
 (Step 10) Release of attraction of the layered substrate 100 by the second film 21 of the second chamber 20
 (Step 11) Transfer of the layered substrate 100 from the substrate bonding apparatus 2

Next, Steps 1 to 11 will be described in this order.

Note that, in each of Steps 1 to 11, a modified example may be described.

In the following explanation, "substrate bonding apparatus 2A" may be referred to as "substrate bonding apparatus 2". Furthermore, each of the substrate bonding apparatuses 2B to 2D has the same configuration as that of the substrate bonding apparatus 2.

(Step 1: Transfer of the Layered Substrate 100 to the Substrate Bonding Apparatus 2)

In the semiconductor manufacturing apparatus 1 shown in FIG. 1, a plurality of layered substrates 100 which are not subjected to the bonding process are stored in the substrate holders 4A and 4B. The first transfer device 3A takes out a layered substrate 100 from the substrate holders 4A and 4B. The second transfer device 3B transfers the layered substrate 100 that was taken out by the first transfer device 3A to the substrate bonding apparatus 2A.

Modified Example of Step 1

In other cases, instead of the layered substrate 100, a first substrate 110 and a second substrate 120 which are not layered may be stored in the substrate holders 4A and 4B. In this case, for example, one of the processing units U1 to U4 constituting the semiconductor manufacturing apparatus 1 is a pre-processing apparatus that forms the layered substrate 100. The first substrate 110 and the second substrate 120 are transferred to the pre-processing apparatus by transfer operation of the first transfer device 3A and the second transfer device 3B.

In the pre-processing apparatus, positioning of the first substrate 110 and the second substrate 120 in both the X-direction and the Y-direction is carried out, a plurality of substrates are layered in the Z-direction, and therefore the layered substrate 100 is formed. In the pre-processing apparatus, the first substrate 110 and the second substrate 120 are not bonded by pressurization, and it is necessary to bond the substrates via use of the substrate bonding apparatus 2A.

The second transfer device 3B transfers the layered substrate 100 from the pre-processing apparatus to the substrate bonding apparatus 2A.

(Step 2: Attraction of the Layered Substrate 100 by the Second Film 21 of the Second Chamber 20)

The layered substrate 100 transferred to the substrate bonding apparatus 2A is mounted on the second film 21 of the second chamber 20. As the second pressure reducer 85 is driven, the space (gap) between a lower surface of the layered substrate 100 (a lower surface of the second substrate 120) and the second surface 21S is suctioned, and the layered substrate 100 and the second film 21 are brought into close contact with each other (refer to FIG. 3).

(Step 3: Downward Movement of the First Chamber 10)

Next, as the mover 60 is driven, the first chamber 10 moves in a downward direction in the Z-direction. The first film 11 gradually approaches the second film 21 along with the movement of the first chamber 10, and thereafter the first surface 11S of the first film 11 comes into contact with an upper surface of the layered substrate 100 (an upper surface of the first substrate 110).

When the first chamber 10 moves toward the second chamber 20, the first seal 71 comes into contact with the second seal 72, the distance between the first outer-peripheral portion 13 and the second outer-peripheral portion 23 becomes shorter, and the first seal 71 and the second seal 72 are compressed between the first outer-peripheral portion 13 and the second outer-peripheral portion 23. Accordingly, the space 76 surrounded by the first film 11, the second film 21, the first seal 71, and the second seal 72 is tightly sealed.
(Step 4: Decompression of the Space 76)

Next, as the first pressure reducer 75 is driven, the space 76 is depressurized.

Such decompression step may be continuously carried out in a state in which a pressure is applied to the layered substrate 100 by the pressurized incompressible fluid L. Alternatively, after the pressure inside the space 76 reaches a desired pressure, the decompression operation by the first pressure reducer 75 may be stopped.

According to carrying out Step 4, air that enters between the first substrate 110 and the second substrate 120 which constitute the layered substrate 100 is removed, and it is possible to increase a degree of contact between the first substrate 110 and the second substrate 120. In addition to this effect, it is possible to increase a degree of contact of the layered substrate 100 with respect to each of the first film 11 and the second film 21.

Both the improvement in the degree of contact between the first substrate 110 and the second substrate 120 and the improvement in the degree of contact of the layered substrate 100 with respect to each of the first film 11 and the second film 21 contribute to uniformization of a profile of the applied pressure to the layered substrate 100 by the pressurized incompressible fluid L.
(Step 5: Temperature Control of the Incompressible Fluid L)

The temperature controller 50 heats the incompressible fluid L based on the measurement result obtained by the temperature sensor 14. Since the temperature controller 50 is provided at the fluid pressure adjuster 40, the temperature of the incompressible fluid L stored in the fluid pressure adjuster 40 is controlled. The heat of the incompressible fluid L in the fluid pressure adjuster 40 is transmitted to the incompressible fluid L filling the inside of the flow-channel structure 30 and is further transmitted to the incompressible fluid L stored in the first container 12 and the second container 22. The heat of the incompressible fluid L is also transmitted to the first film 11 and the second film 21, and the heat is applied to the layered substrate 100 that is in contact with the first film 11 and the second film 21. As a result, the temperature of the layered substrate 100 is controlled.

Modified Example 1 of Step 5

Note that, Step 5 does not necessarily need to be carried out after Step 4.

Step 5 may be carried out before the substrate bonding process using the substrate bonding apparatus 2A is carried out, that is, when the substrate bonding apparatus 2A is in an idling state.

Before the layered substrate 100 is transferred to the substrate bonding apparatus 2A, by setting the temperature of the incompressible fluid L to a predetermined temperature, it is possible to promptly carry out Steps 6 to 11 which will be described later.

Modified Example 2 of Step 5

Step 5 may be simultaneously carried out in each of the four substrate bonding apparatuses 2A to 2D. In this case, for example, the temperatures of the incompressible fluid L in the four substrate bonding apparatuses 2A to 2D may be different from each other. Specifically, the temperatures of the incompressible fluid L of the four substrate bonding apparatuses 2A to 2D may be set to 200° C., 250° C., 300° C., and 350° C., respectively. The substrate bonding processes may be carried out in the four substrate bonding apparatuses 2A to 2D such that the temperature of the layered substrate 100 gradually increases by heating. For example, initially, the substrate bonding process is carried out with respect to the layered substrate 100 in a state in which the temperature of the incompressible fluid L is set to 200° C., and thereafter the substrate bonding processes are carried out with respect to the layered substrate 100 in order that the temperature becomes higher such that the temperature conditions of the incompressible fluid L are 250° C., 300° C., and 350° C. The above-described substrate bonding processes while gradually applying heat to the layered substrate 100 are achieved by the second transfer device 3B that transfers the layered substrate 100 to the four substrate bonding apparatuses 2A to 2D.
(Step 6: Application of Pressure to the Layered Substrate 100)

As the fluid pressure adjuster 40 is driven, the fluid pressure adjuster 40 applies a pressure to the incompressible fluid L. When a pressure is applied to the incompressible fluid L, the pressure is applied to the incompressible fluid L filling the first flow channel 31 and the first container 12 and is applied to the incompressible fluid L filling the second flow channel 32 and the second container 22. Due to the above-described action of pressure transmission, the first film 11 is deformed to bulge toward the layered substrate 100, and the second film 21 is deformed to bulge toward the layered substrate 100.

Accordingly, as shown in FIG. 6, the pressures are applied to both the surfaces of the layered substrate 100 by the first film 11 and the second film 21. Moreover, in Step 5, the heat of the incompressible fluid L is transferred to the layered substrate 100, and the layered substrate 100 is heated.

FIG. 7 shows in a state in which the layered substrate 100 is pressurized by the incompressible fluid L. When the incompressible fluid L applies a pressure to the layered substrate 100 via the first film 11 and the second film 21, force in the Z-direction acts on the layered substrate 100, and furthermore, force in diagonal directions D with respect to the Z-direction acts on the layered substrate 100, for example, on the peripheral edge portion of the layered substrate 100.

Here, the action of the force in the diagonal directions D is, for example, an action of force generated in the directions oblique to the Z-direction and the X-direction or an action of force generated in the directions oblique to the Z-direction and the Y-direction. In other words, isotropic force that acts on the layered substrate 100 is generated between the first film 11 and the layered substrate 100 and is generated between the second film 21 and the layered substrate 100.

As a result, since the layered substrate 100 is pressurized while heating the layered substrate 100, the first connection terminals 112 of the first substrate 110 are bonded one-toone to the second connection terminals 122 of the second substrate 120. Here, as the "bond", for example, metallic bonding or hydrogen bonding is adopted.

(Step 7: Release of Application of Pressure to the Layered Substrate 100)

After Step 6 is completed, as the fluid pressure adjuster 40 is driven, the application of the pressure to the layered substrate 100 by the incompressible fluid L is released.

(Step 8: Release of Decompression of the Space 76)

The driving of the first pressure reducer 75 is stopped, and the pressure inside the space 76 becomes atmospheric pressure via a known purging.

(Step 9: Upward Movement of the First Chamber 10)

As the mover 60 is driven, the first chamber 10 moves upward in the Z-direction. The first film 11 moves separately from the second film 21 along with the movement of the first chamber 10.

(Step 10: Release of Attraction of the Layered Substrate 100 by the Second Film 21 of the Second Chamber 20)

The pressure inside the space between the first film 11 and the layered substrate 100 becomes atmospheric pressure via a known purging.

(Step 11: Transfer of the Layered Substrate 100 from the Substrate Bonding Apparatus 2)

The second transfer device 3B transfers the layered substrate 100 from the substrate bonding apparatus 2A.

According to the aforementioned semiconductor manufacturing apparatus 1, a pressure is inhibited from being locally applied (pin pointed) to the layered substrate 100, and it is possible to uniformize the profile of the pressure applied to the layered substrate 100 from each of the first film 11 and the second film 21. As a result, the first connection terminals 112 can be bonded one-to-one to the second connection terminals 122.

Since the layered substrate 100 is heated by the incompressible fluid L, the first connection terminals 112 of the first substrate 110 can be pressure-bonded one-to-one to the second connection terminals 122 of the second substrate 120 while maintaining the heating temperature required to bond the first connection terminals 112 and the second connection terminals 122.

Furthermore, since the pressure of the incompressible fluid L can be easily controlled by driving the fluid pressure adjuster 40 and furthermore the temperature of the incompressible fluid L can be easily controlled by the temperature controller 50, it is possible to improve controllability of the substrate bonding process using the substrate bonding apparatus 2.

Moreover, since the first connection terminals 112 can be bonded one-to-one to the second connection terminals 122 for a short period of time while heating and pressurizing the layered substrate 100, it contributes to improvement in throughput of the semiconductor manufacturing apparatus 1 and the substrate bonding apparatus 2.

According to at least one embodiment described above, in a state in which the layered substrate is disposed between the first film and the second film, the pressurized incompressible fluid deforms the first film and the second film so as to bond a plurality of substrates constituting the layered substrate and thereby applies the pressure to the layered substrate. Accordingly, it is possible to stabilize the process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
   a first chamber comprising a first film and a first container, the first film being deformable, the first container containing an incompressible fluid that causes the first film to be deformed;
   a second chamber comprising a second film facing the first film and a second container, the second film being deformable, the second container containing the incompressible fluid that causes the second film to be deformed;
   a fluid pressure adjuster configured to apply a pressure to the incompressible fluid of each of the first chamber and the second chamber to cause the first film and the second film to be deformed in bonding a plurality of substrates to each other between the first film and the second film;
   a seal provided between the first chamber and the second chamber, the seal surrounding peripheries of the first film and the second film; and
   a first pressure reducer provided with a vacuum pump and a vacuum valve, the first pressure reducer being configured to depressurize an inside of a space surrounded by the first film, the second film, and the seal, during a first pressure reduction, wherein
   the plurality of the substrates form a multi-layered substrate comprising a first substrate surface, a second substrate surface, and a side substrate surface,
   the second substrate surface is on an opposite side of the first substrate surface,
   the side substrate surface extends in a thickness direction of the multi-layered substrate between the first substrate surface and the second substrate surface,
   the first pressure reducer depressurizes the inside of the space during the first pressure reduction in a state in which: the first film faces the first substrate surface, the second film faces the second substrate surface, and the seal faces the side substrate surface.

2. The semiconductor manufacturing apparatus according to claim 1, further comprising:
   a flow-channel structure provided between the first chamber and the fluid pressure adjuster and between the second chamber and the fluid pressure adjuster, wherein
   the pressure applied to the incompressible fluid in the first chamber and the second chamber by the fluid pressure adjuster is transmitted to the first film and the second film by the flow-channel structure.

3. The semiconductor manufacturing apparatus according to claim 1, further comprising:
   a temperature sensor measuring at least one of temperatures of the first film and the second film; and
   a temperature controller controlling a temperature of the incompressible fluid of each of the first chamber and the second chamber based on a measurement result obtained by the temperature sensor in the case of deforming the first film and the second film by the fluid pressure adjuster and bonding the substrates.

4. The semiconductor manufacturing apparatus according to claim 1, wherein
   at least one of the first film and the second film includes a substrate attractor, the substrate attractor includes an inner hole, an attraction path, and an outer hole, the semiconductor manufacturing apparatus further comprises a second pressure reducer, the second pressure reducer is provided with a vacuum pump and a vacuum valve, the substrate attractor is configured to attract and hold a part of the substrates disposed in a space between the first film and the second film, the inner hole communicates the space between the first film and the second film, the attraction path communicates the inner hole, the attraction path extending in a radial direction, the outer hole communicates the attraction path, and the second pressure reducer is connected to the outer hole.

5. The semiconductor manufacturing apparatus according to claim 1, further comprising:

a motor configured to adjust a distance between the first film and the second film.

6. A semiconductor manufacturing method comprising:

disposing a plurality of substrates between a first chamber and a second chamber, the first chamber comprising a first film and a first container, the first container containing an incompressible fluid, the first film being deformable via the incompressible fluid, the second chamber comprising a second film facing the first film and a second container, the second container containing the incompressible fluid, the second film being deformable via the incompressible fluid wherein the plurality of the substrates form a multi-layered substrate comprising a first substrate surface, a second substrate surface, and a side substrate surface, the second substrate surface is on an opposite side of the first substrate surface, the side substrate surface extends in a thickness direction of the multi-layered substrate between the first substrate surface and the second substrate surface;

defining a space surrounded by the first film, the second film, and a seal so as to dispose the multi-layered substrate in an inside of the space, the seal being provided between the first chamber and the second chamber, the seal surrounding peripheries of the first film and the second film;

depressurizing the inside of the space in a state in which: the first film faces the first substrate surface, the second film faces the second substrate surface, and the seal faces the side substrate surface; and applying a pressure to the incompressible fluid of each of the first chamber and the second chamber to cause the first film and the second film to be deformed, and bonding the substrates to each other between the first film and the second film.

7. The semiconductor manufacturing method according to claim 6, further comprising:

controlling a temperature of the incompressible fluid of the first chamber and the second chamber based on a measurement result obtained by measuring a temperature of at least one of the first film and the second film.

8. The semiconductor manufacturing method according to claim 6, further comprising:

attracting a part of the substrates via a substrate attractor provided at least one of the first film and the second film by use of a pressure reducer, wherein the substrate attractor includes an inner hole, an attraction path, and an outer hole, the pressure reducer is provided with a vacuum pump and a vacuum valve.

* * * * *